(12) United States Patent
Niu et al.

(10) Patent No.: US 11,159,180 B2
(45) Date of Patent: Oct. 26, 2021

(54) METHOD AND APPARATUS FOR CONSTRUCTING A POLAR CODE

(71) Applicant: Beijing University of Posts and Telecommunications, Beijing (CN)

(72) Inventors: Kai Niu, Beijing (CN); Yan Li, Beijing (CN)

(73) Assignee: Beijing University of Posts and Telecommunications, Beijing (CN)

( * ) Notice: Subject to any disclaimer, the term of this patent is extended or adjusted under 35 U.S.C. 154(b) by 0 days.

(21) Appl. No.: 16/979,749

(22) PCT Filed: Jun. 26, 2019

(86) PCT No.: PCT/CN2019/093040
§ 371 (c)(1),
(2) Date: Sep. 10, 2020

(87) PCT Pub. No.: WO2020/113945
PCT Pub. Date: Jun. 11, 2020

(65) Prior Publication Data
US 2021/0044305 A1 Feb. 11, 2021

(30) Foreign Application Priority Data
Dec. 7, 2018 (CN) .......................... 201811494300.4

(51) Int. Cl.
*H03M 13/13* (2006.01)
*H03M 13/00* (2006.01)
(Continued)

(52) U.S. Cl.
CPC ........ *H03M 13/13* (2013.01); *G06F 13/1668* (2013.01); *H04L 1/0057* (2013.01)

(58) Field of Classification Search
CPC ... G06F 13/1668; H03M 13/13; H04L 1/0057
See application file for complete search history.

(56) References Cited

U.S. PATENT DOCUMENTS 10,326,478 B2 * 6/2019 Trifonov .............. H03M 13/611
10,812,107 B2 * 10/2020 Saber .................... H04L 1/0058
(Continued)

FOREIGN PATENT DOCUMENTS

CN      106899311 A    6/2017
CN      107342842 A    11/2017
(Continued)

OTHER PUBLICATIONS

G. He et al., β-expansion: A Theoretical Framework for Fast and Recursive Construction of Polar Codes,Ottawa Research Center, Huawei Technologies, arXiv:1704.05709v1 [cs.IT] Apr. 19, 2017, pp. 1-7.
(Continued)

*Primary Examiner* — Justin R Knapp
(74) *Attorney, Agent, or Firm* — Clements Bernard Baratta; Lawrence A. Baratta, Jr.

(57) ABSTRACT

A polar code construction method, apparatus, electronic device, and readable storage medium, applied to the field of wireless communication technology to reduce the complexity of polar code construction. The method comprises: calculating a weight spectrum corresponding to a polarized channel of a polar code with code length 2N based on the weight spectrum corresponding to the polarized channel with code length N, and MacWilliams identities; calculating, for each polarized channel, a union bound on the error probability of the polarized channel under the condition of
(Continued)

additive white Gaussian noise based on the weight spectrum corresponding to the polarized channel and a union bound formula; determining the error probability threshold values based on the union bounds and a measurement method; sorting the error probability threshold values of all the polarized channels in ascending order, and selecting the polarized channels corresponding to the K smallest error probability threshold values.

10 Claims, 3 Drawing Sheets

(51) Int. Cl.
    *G06F 13/00*     (2006.01)
    *H04L 1/00*     (2006.01)
    *G06F 13/16*     (2006.01)

(56) References Cited

U.S. PATENT DOCUMENTS

| | | | | |
|---|---|---|---|---|
| 10,866,857 | B2 * | 12/2020 | Presman | H03M 13/3977 |
| 10,985,779 | B2 * | 4/2021 | Arikan | G06F 11/1004 |
| 2018/0323905 | A1 | 11/2018 | Shelby | |

FOREIGN PATENT DOCUMENTS

| | | |
|---|---|---|
| CN | 108111252 A | 6/2018 |
| CN | 108599891 A | 9/2018 |
| CN | 109361495 A | 2/2019 |
| WO | 2018153260 A1 | 8/2018 |

OTHER PUBLICATIONS

Zhu et al., MacWilliams Identities of Linear Codes Over Ring R+vR+v2R, Acta Electronica Sinica, vol. 44, No. 7, Jul. 2016, pp. 1-7.

J. Li et al., Research on Polar Code Construction Algorithms under Gaussian Channel, 978-1-5386-4646-5/18, IEEE, ICUFN 2018, pp. 515-518.

Qualcomm Incorporated, Sequence construction of Polar codes for control channel, 3GPP TSG-RAN WG1 #90 R1-1713468, Aug. 21-25, 2017, Prague, Czech Republic, pp. 1-15.

D. Zhou et al., Universal Construction for Polar Coded Modulation, IEEE Access, Special Section on Advances in Channel Coding for 5G and Beyond, vol. 6, 2018, pp. 57518-57525.

Sep. 30, 2019, International Search Report for International application No. PCT/CN2019/093040.

* cited by examiner

METHOD AND APPARATUS FOR CONSTRUCTING A POLAR CODE

The present application is a national stage application of PCT Application No. PCT/CN2019/093040 which claims the priority to a Chinese Patent Application No. 201811494300.4, filed with the China National Intellectual Property Administration on Dec. 7, 2018 and entitled "A POLAR CODE CONSTRUCTION METHOD, APPARATUS, ELECTRONIC DEVICE, AND READABLE STORAGE MEDIUM", each of which is incorporated herein by reference in its entirety.

TECHNICAL FIELD

The present application relates to the field of wireless communication technology, and in particular to a method, apparatus, electronic device, and readable storage medium for constructing a polar code.

BACKGROUND

Additive white Gaussian noise (AWGN) is a common noise model in wireless communication, where the amplitude of the noise obeys the normal distribution, and the power spectral density of the noise is uniformly distributed. A channel having AWGN is named as an AWGN channel, which is an ideal channel model usually used in a communication system. The Gaussian approximation (GA) is a simplified method of the density evolution (DE) algorithm, which is used for estimating the reliabilities of the polarized channels in a polar code, that is, estimating error probabilities corresponding to the polarized channels. In the binary additive white Gaussian noise channel (BAWGNC), the GA algorithm approximates the logarithm likelihood ratio (LLR) in the DE method with a set of Gaussian distributed random variables whose variance is twice the mean. Since the Gaussian distributed probability density function (PDF) can be completely determined by the mean and variance, one can master the PDF of the LLR by tracking the variation of the mean under the assumption of Gaussian approximation.

However, in the practical digital communication system, when constructing a polar code by means of the GA algorithm, it is required to construct it per signal-to-noise ratio, that is, when the signal-to-noise ratio changes, it is required to recalculate the error probabilities of the polarized channels, which leads to high computational complexity and thus low practicality.

SUMMARY

In order to reduce the complexity of constructing a polar code and improve the practicality, this application aims to provide a polar code construction method, apparatus, electronic device, and readable storage medium. The specific technical solutions are as follows.

An embodiment of the present application provides a method for constructing a polar code, and the method comprises:

calculating a polar weight spectrum $A_{2N}^{(l)}(p)$ corresponding to an $l^{th}$ polarized channel of a polar code with code length 2N based on a polar weight spectrum $A_N^{(i)}(j)$ corresponding to an $i^{th}$ polarized channel of a polar code with code length N and a formula $$\begin{cases} A_{2N}^{(l)}(p) = A_N^{(i)}(j), \ p = 2j, \\ A_{2N}^{(l)}(p) = 0, \ p \text{ is a positive odd number less than } 2N \end{cases},$$

where i=1, 2, ..., N, l=i+N, j=0, 1, 2, ..., N, j denotes a weight of a codeword in the polar code with code length N, p denotes a weight of a codeword in the polar code with code length 2N, $N=2^x$, x is a positive integer;

calculating a polar weight spectrum $A_{2N}^{(m)}(p)$ corresponding to an $m^{th}$ polarized channel of the polar code with code length 2N, based on the polar weight spectrum $A_{2N}^{(l)}(p)$ corresponding to the $l^{th}$ polarized channel and the MacWilliams identities, where m=1, 2, ..., N;

calculating, for each polarized channel, a union bound on an error probability of the polarized channel under the condition of additive white Gaussian noise channel based on the polar weight spectrum corresponding to the polarized channel of the polar code with code length 2N and the union bound calculation formula;

determining the error probability threshold values of the polarized channels based on the union bounds of the polarized channels and a predetermined measurement method;

given the code length 2N and code rate K/2N, sorting the error probability threshold values of all the polarized channels in ascending order, and selecting polarized channels corresponding to the K smallest error probability threshold values to transmit information bits, while selecting the rest of polarized channels to transmit frozen bits; where K denotes a length of information bits.

Optionally, determining the error probability threshold values of the polarized channels based on the union bounds of the polarized channels and a predetermined measurement method, comprises:

for each of the polarized channels, determining the union bound of the polarized channel as the error probability threshold value of the polarized channel; or determining the logarithmic form of the union bound of the polarized channel as the error probability threshold value of the polarized channel; or selecting the item corresponding to the minimum Hamming weight in the logarithmic form of the union bound of the polarized channel as the error probability threshold value of the polarized channel.

Optionally, calculating the polar weight spectrum $A_{2N}^{(m)}(p)$ corresponding to the $m^{th}$ polarized channel of the polar code with code length 2N, based on the polar weight spectrum $A_{2N}^{(l)}(p)$ corresponding to the $l^{th}$ polarized channel and the MacWilliams identities, comprises:

calculating the weight spectrum $S_{2N}^{(l)}(p)$ corresponding to the $l^{th}$ polarized channel of the polar code with code length 2N by using the formula $$S_{2N}^{(l)}(p) = \sum_{k=l}^{2N} A_{2N}^{(k)}(p);$$

calculating the weight spectrum $S_{2N}^{(m)}(p)$ corresponding to the $m^{th}$ polarized channel of the polar code with code length 2N based on the MacWilliams identities $$\sum_{p=0}^{2N-v} \binom{2N-p}{v} S_{2N}^{(m)}(p) = 2^{2N-m+1-v} \sum_{p=0}^{v} \binom{2N-p}{2N-v} S_{2N}^{(2N+2-m)}(p),$$

where $$\binom{2N-p}{v} = \frac{(2N-p)!}{v!(2N-p-v)!}, \binom{2N-p}{2N-v} = \frac{(2N-p)!}{(2N-v)!(v-p)!},$$

and $v = 0, 1, \ldots, 2N$;

calculating the polar weight spectrum $A_{2N}^{(m)}(p)$ corresponding to the $m^{th}$ polarized channel of the polar code with code length 2N based on $A_{2N}^{(m)}(p)=S_{2N}^{(m)}(p)-S_{2N}^{(m+1)}(p)$.

Optionally, calculating the union bound on the error probability of the polarized channel under the condition of additive white Gaussian noise channel based on the polar weight spectrum corresponding to the polarized channel of the polar code with code length 2N and the union bound calculation formula, comprises:

determining the union bound of the $q^{th}$ polarized channel under the condition of the additive white Gaussian noise channel as $$P_{UB}(W_{2N}^{(q)}) = \sum_p A_{2N}^{(q)}(p) \exp\left\{-p\frac{E_s}{N_0}\right\}$$

by using the formula $$P(W_{2N}^{(q)}) \le \sum_p A_{2N}^{(q)}(p) \exp\left\{-p\frac{E_s}{N_0}\right\},$$

where $q=1, 2, \ldots, 2N$, denotes the error probability of the $q^{th}$ polarized channel, $E_s$ denotes the average energy of the transmitted signal, $N_0$ denotes the noise power spectral density, and $E_s/N_0$ denotes the symbol signal-to-noise ratio (SNR).

An embodiment of the present application provides an apparatus for constructing a polar code, the apparatus comprises:

a first module to calculate the polar weight spectrum, configured for calculating a polar weight spectrum $A_{2N}^{(l)}(p)$ corresponding to the $l^{th}$ polarized channel of the polar code with code length 2N, based on the polar weight spectrum corresponding to the $i^{th}$ polarized channel of the polar code with code length N and the formula $$\begin{cases} A_{2N}^{(l)}(p) = A_N^{(i)}(j), p = 2j, \\ A_{2N}^{(l)}(p) = 0, p \text{ is a positive odd number less than } 2N \end{cases},$$

where $i=1, 2, \ldots, N$, $l=i+N$, $j=0, 1, 2, \ldots, N$, $j$ denotes the weight of a codeword in the polar code with code length N, $p$ denotes the weight of a codeword in the polar code with code length 2N, $N=2^x$, and x is a positive integer;

a second module to calculate the polar weight spectrum, configured for calculating the polar weight spectrum $A_{2N}^{(m)}(p)$ corresponding to the $m^{th}$ polarized channel of the polar code with code length 2N, based on the polar weight spectrum $A_{2N}^{(l)}(p)$ corresponding to the $l^{th}$ polarized channel and the MacWilliams identities, where $m=1, 2, \ldots, N$;

a module to determine the union bound, configured for calculating, for each polarized channel, the union bound on the error probability of the polarized channel under the condition of additive white Gaussian noise channel based on the polar weight spectrum corresponding to the polarized channel of the polar code with code length 2N and the union bound calculation formula;

a module to determine the error probability threshold value, configured for determining the error probability threshold values of the polarized channels based on the union bounds of the polarized channels and a predetermined measurement method;

a module to construct a polar code, configured for, given the code length 2N and code rate K/2N, sorting the error probability threshold values of all the polarized channels in ascending order, and selecting the polarized channels corresponding to the K smallest error probability threshold values to transmit information bits, while selecting the rest of the polarized channels to transmit frozen bits, where K denotes the length of information bits.

Optionally, the module to determine the error probability threshold value comprises:

a first sub-module, configured for, for each of the polarized channels, determining the union bound of the polarized channel as the error probability threshold value of the polarized channel;

a second sub-module, configured for, for each of the polarized channels, determining the logarithmic form of the union bound of the polarized channel as the error probability threshold value of the polarized channel;

a third sub-module, configured for, for each of the polarized channels, selecting the item corresponding to the minimum Hamming weight in the logarithmic form of the union bound of the polarized channel as the error probability threshold value of the polarized channel.

Optionally, the second module to calculate the polar weight spectrum is specifically configured for: calculating the weight spectrum $S_{2N}^{(l)}(p)$ corresponding to the $l^{th}$ polarized channel of the polar code with code length 2N by using the formula $$S_{2N}^{(l)}(p) = \sum_{k=l}^{2N} A_{2N}^{(h)}(p);$$

calculating the weight spectrum $S_{2N}^{(m)}(p)$ corresponding to the $m^{th}$ polarized channel of the polar code with code length 2N based on the MacWilliams identities $$\sum_{p=0}^{2N-v} \binom{2N-p}{v} S_{2N}^{(m)}(p) = 2^{2N-m+1-v} \sum_{p=0}^{v} \binom{2N-p}{2N-v} S_{2N}^{(2N+2-m)}(p),$$

where $$\binom{2N-p}{v} = \frac{(2N-p)!}{v!(2N-p-v)!}, \binom{2N-p}{2N-v} = \frac{(2N-p)!}{(2N-v)!(v-p)!},$$

and $v = 0, 1, \ldots, 2N$;

calculating the polar weight spectrum $A_{2N}^{(m)}(p)$ corresponding to the $m^{th}$ polarized channel of the polar code with code length 2N by using $A_{2N}^{(m)}(p) = S_{2N}^{(m)}(p) - S_{2N}^{(m+1)}(p)$.

Optionally, the module to determine the union bound is specifically configured for: determining the union bound of the $q^{th}$ polarized channel under the condition of the additive white Gaussian noise channel as $$P_{UB}(W_{2N}^{(q)}) = \sum_{p} A_{2N}^{(q)}(p) \exp\left\{-p \frac{E_z}{N_0}\right\}$$

by using the formula $$P(W_{2N}^{(q)}) \leq \sum_{p} A_{2N}^{(q)}(p) \exp\left\{-p \frac{E_s}{N_0}\right\},$$

where q=1, 2, ..., 2N, $P(W_{2N}^{(q)})$ denotes the error probability of the $q^{th}$ polarized channel, $E_s$ denotes the average energy of the transmitted signal, $N_0$ denotes the noise power spectral density, and $E_s/N_0$ denotes the symbol signal-to-noise ratio (SNR).

An embodiment of the present application provides an electronic device. The electronic device comprises: a processor, a communication interface, a memory and a communication bus, where the processor, the communication interface and the memory communicate with each other via the communication bus;

the memory is configured for storing a computer program;

the processor is configured for implementing any above steps of the method for constructing a polar code when executing the computer program stored in the memory.

An embodiment of the present application provides a computer-readable storage medium. The computer-readable storage medium stores a computer program therein, and the computer program is executed by a processor to implement steps of the method for constructing a polar code.

In the polar code construction method, apparatus, electronic device, and readable storage medium provided by embodiments of the present application: the polar weight spectrum corresponding to each polarized channel of the polar code with code length 2N is calculated, based on the polar weight spectrum corresponding to each polarized channel of the polar code with code length N and the MacWilliams identities; the union bound of each polarized channel under the condition of the additive white Gaussian noise channel is calculated based on the polar weight spectrum corresponding to each polarized channel of the polar code with code length 2N and the union bound calculation formula; the error probability threshold value of each polarized channel is determined based on the union bound and a predetermined measurement method; given the code length 2N and code rate K/2N, the error probability threshold values are sorted in ascending order, then the polarized channels corresponding to the K smallest error probability threshold values are selected to transmit information bits, and the rest of the polarized channels are selected to transmit frozen bits. The construction method of polar codes provided by the embodiments of this application can be SNR-independent, which reduces the complexity for constructing a polar code, and has a good practical prospect for the polar coded transmission system.

BRIEF DESCRIPTION OF THE DRAWINGS

In order to describe the technical solutions of the embodiments of this application and that of the prior art more clearly, drawings used in the embodiments and the prior art will be briefly described below. Obviously, the drawings described below only correspond to some embodiments of this application, and the technicians in this field can also obtain other drawings based on these drawings without any creative efforts.

DETAILED DESCRIPTION

In order to make the objectives, technical solutions and advantages of the present application clearer and more understandable, the present application will be further described in detail below with reference to the drawings and embodiments. Obviously, the described embodiments are only part, and not all, of the embodiments of the present application. All other embodiments obtained based on the embodiments of this application by the technicians in this field without any creative efforts fall into the scope of protection defined by the present application.

In order to solve the problem that the computational complexity of constructing a polar code is too high for practical application, the embodiments of the present application provide a polar code construction method, an apparatus, an electronic device and a readable storage medium to reduce the complexity of constructing a polar code.

Firstly, the method for constructing a polar code provided by an embodiment of the present application is described in detail below.

Figure 1:
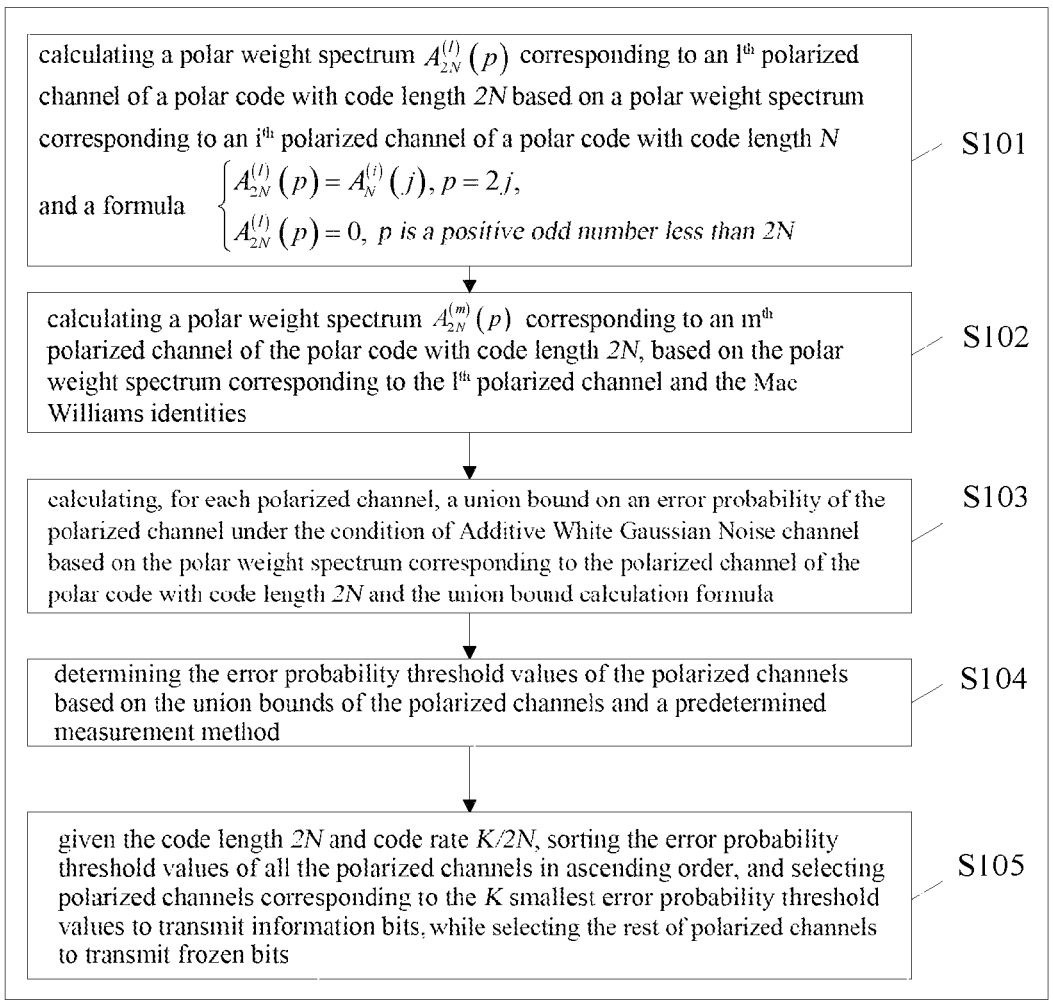
FIG. 1 shows a flowchart of the method for constructing a polar code according to an embodiment of the present application.

Referring to FIG. 1, FIG. 1 shows a flowchart of the method for constructing a polar code according to an embodiment of the present application. The method comprises the following steps.

S101, calculate the polar weight spectrum $A_{2N}^{(l)}(p)$ corresponding to the $l^{th}$ polarized channel of the polar code with code length 2N, based on the polar weight spectrum $A_{2N}^{(i)}(j)$ corresponding to the $i^{th}$ polarized channel of the polar code with code length N and using the formula $$\begin{cases} A_{2N}^{(l)}(p) = A_N^{(i)}(j), \ p = 2j, \\ A_{2N}^{(l)}(p) = 0, \ p \text{ is a positive odd number less than } 2N \end{cases},$$

where i=1, 2, ..., N, l=i+N, j=0, 1, 2, ..., N, j denotes the weight of a codeword in the polar code with code length N, p denotes the weight of a codeword in the polar code with code length 2N, $N=2^x$, and x is a positive integer.

In the embodiment of the present application, if the generator matrix for the polar code with code length N is represented as $F_N$, and the generator matrix for the polar code with code length 2N is represented as $F_{2N}$, then there is a recursive relationship:

$$F_{2N} = \begin{bmatrix} F_N & 0 \\ F_N & F_N \end{bmatrix}.$$

For example, if there is $$F_2 = \begin{bmatrix} 1 & 0 \\ 1 & 1 \end{bmatrix},$$

then for a polar code with N=4, there is $$F_4 = \begin{bmatrix} 1 & 0 & 0 & 0 \\ 1 & 1 & 0 & 0 \\ 1 & 0 & 1 & 0 \\ 1 & 1 & 1 & 1 \end{bmatrix}.$$

N polarized channels will be obtained after the channel polarization transformation is performed on the polar code with code length N, and the index of the polarized channel is denoted by i.

A codeword vector of the polar code is obtained by $e=uF_N$, where u is the 1×N source information vector.

For the polar code with N=4, $$F_4 = \begin{bmatrix} 1 & 0 & 0 & 0 \\ 1 & 1 & 0 & 0 \\ 1 & 0 & 1 & 0 \\ 1 & 1 & 1 & 1 \end{bmatrix},$$

and four polarized channels will be obtained after the channel polarization transformation. Based on the relationship between polarized channels and linear block codes, the linear block code corresponding to the polarized channel with i=4 only uses the $4^{th}$ row of the generator matrix $F_4$. Then the first three bits of the source information vector u are fixed as 0, and only the $4^{th}$ bit can be chosen randomly as 0 or 1. Therefore, the codewords corresponding to the polarized channel with i=4 can be obtained as the following Table 1.

TABLE 1

| u | c = uF$_4$ | j |
|---|---|---|
| [0 0 0 0] | [0 0 0 0] | 0 |
| [0 0 0 1] | [1 1 1 1] | 4 |

As shown in Table 1, for the polarized channel with i=4, there are two codewords. It can be observed from the third column of Table 1, the Hamming weights of the two codewords are 0 and 4, respectively.

Let the weight spectrum $S_N^{(i)}(j)$ denote the number of codewords with Hamming weight j in the linear block code corresponding to the polarized channel with index i. Thus, the weight spectrum of the polarized channel with i=4 can be obtained as the Table 2 below.

TABLE 2

| i | j | $S_4^{(i)}$ (j) |
|---|---|---|
| 4 | 0 | 1 |
| 4 | 4 | 1 |

Based on the relationship between the polarized channels and the linear block codes, the linear block code corresponding to the polarized channel with i=3 only uses the $3^{rd}$ and $4^{th}$ rows of the generator matrix $F_4$. Then the first two bits of the source information vector u are fixed as 0, and the last two bits can be chosen randomly as 0 or 1. Therefore, the codewords corresponding to the polarized channel with i=3 can be obtained as the following Table 3.

TABLE 3

| u | c = uF$_4$ | j |
|---|---|---|
| [0 0 0 0] | [0 0 0 0] | 0 |
| [0 0 0 1] | [1 1 1 1] | 4 |
| [0 0 1 0] | [1 0 1 0] | 2 |
| [0 0 1 1] | [0 1 0 1] | 2 |

As shown in Table 3, for the polarized channel with i=3, there are four codewords, including one with weight 0, one with weight 4, and two with weight 2. Thus, the weight spectrum of the polarized channel with i=3 can be obtained as the Table 4 below.

TABLE 4

| i | j | $S_4^{(i)}$ (j) |
|---|---|---|
| 3 | 0 | 1 |
| 3 | 2 | 2 |
| 3 | 4 | 1 |

Similarly, when i=2, the linear block code corresponding to the polarized channel with i=2 only uses the last three rows of the generator matrix $F_4$, then the $1^{st}$ bit of the source information vector u is fixed as 0, and the last three bits can be chosen randomly as 0 or 1. Therefore, the codewords corresponding to the polarized channel with i=2 can be obtained as the following Table 5.

TABLE 5

| u | c = uF$_4$ | j |
|---|---|---|
| [0 0 0 0] | [0 0 0 0] | 0 |
| [0 0 0 1] | [1 1 1 1] | 4 |
| [0 0 1 0] | [1 0 1 0] | 2 |
| [0 0 1 1] | [0 1 0 1] | 2 |
| [0 1 0 0] | [1 1 0 0] | 2 |
| [0 1 0 1] | [0 0 1 1] | 2 |
| [0 1 1 0] | [0 1 1 0] | 2 |
| [0 1 1 1] | [1 0 0 1] | 2 |

As shown in Table 5, for the polarized channel with i=2, there are 8 codewords, including one with weight 0, one with weight 4, and six with weight 2. Thus, the weight spectrum of the polarized channel with i=2 can be obtained as the Table 6 below.

TABLE 6

| i | j | $S_4^{(i)}(j)$ |
|---|---|---|
| 2 | 0 | 1 |
| 2 | 2 | 6 |
| 2 | 4 | 1 |

Similarly, when i=1, the linear block code corresponding to the polarized channel with i=1 uses the generator matrix $F_4$, then all the bits of the source information vector u can be chosen randomly as 0 or 1. It is straightforward to know that there are 16 codewords for the polarized channel with i=1 and the corresponding weight spectrum can be shown in Table 7.

TABLE 7

| i | j | $S_4^{(i)}(j)$ |
|---|---|---|
| 1 | 0 | 1 |
| 1 | 1 | 4 |
| 1 | 2 | 6 |
| 1 | 3 | 4 |
| 1 | 4 | 1 |

Combining the above weight spectrums corresponding to all the polarized channels, the complete weight spectrum of the polar code with N=4 is obtained as shown in Table 8.

TABLE 8

| i | j | $S_4^{(i)}(j)$ |
|---|---|---|
| 1 | 0 | 1 |
| 1 | 1 | 4 |
| 1 | 2 | 6 |
| 1 | 3 | 4 |
| 1 | 4 | 1 |
| 2 | 0 | 1 |
| 2 | 2 | 6 |
| 2 | 4 | 1 |
| 3 | 0 | 1 |
| 3 | 2 | 2 |
| 3 | 4 | 1 |
| 4 | 0 | 1 |
| 4 | 4 | 1 |

Comparing the Table 1 and Table 3, it can be observed that the 2 codewords corresponding to the polarized channel with i=4 are included in the 4 codewords corresponding to the polarized channel with i=3; similarly, the 8 codewords corresponding to i=2 are included in the 16 codewords corresponding to i=1. Therefore, a concept named polar weight spectrum is proposed in the embodiment of the present application. The polar weight spectrum corresponding to each polarized channel does not comprise the codewords corresponding to the next polarized channel.

Therefore, the polar weight spectrum can be calculated by the weight spectrum $A_N^{(i)}(j)=S_N^{(i)}(j)-S_N^{(i+1)}(j)$, for i=1, 2, ..., N-1, and $A_N^{(i)}(0)=0$, for i=1, 2, ..., N. The polar weight spectrum of the polar code with N=4 is provided in the following Table 9.

TABLE 9

| i | j | $A_4^{(i)}(j)$ |
|---|---|---|
| 1 | 1 | 4 |
| 1 | 3 | 4 |
| 2 | 2 | 4 |

TABLE 9-continued

| i | j | $A_4^{(i)}(j)$ |
|---|---|---|
| 3 | 2 | 2 |
| 4 | 4 | 1 |

By using the similar method as described above, the polar weight spectrum of the polar code with code length N=8, 16, 32, ... also can be obtained.

Given the polar weight spectrum of the polar code with code length N, for the polar code with code length 2N, if the index of the polarized channel satisfies N+1≤l≤2N, then based on the structure of the matrix $F_{2N}$, the polarized channel is located in the lower half part of the matrix $F_{2N}$, which is composed by partial rows of two identical $F_N$ matrixes repeatedly. Therefore, the $l^{th}$ polarized channel of the polar code with code length 2N corresponds to the $i^{th}$ polarized channel of the polar code with code length N, where N+1≤l≤2N, i=l−N. The relation exists between their corresponding polar weight spectrums is that: $A_{2N}^{(l)}(p)=A_N^{(i)}(j)$ and p=2j. When the code weight p is a positive odd number, the corresponding numbers of codewords are 0.

The polar weight spectrum shown in Table 9 can be equivalently transformed as that in Table 10 below.

TABLE 10

| | j polar weight spectrum | | | | |
|---|---|---|---|---|---|
| i | 0 | 1 | 2 | 3 | 4 |
| 4 | 0 | 0 | 0 | 0 | 1 |
| 3 | 0 | 0 | 2 | 0 | 0 |
| 2 | 0 | 0 | 4 | 0 | 0 |
| 1 | 0 | 4 | 0 | 4 | 0 |

The polar weight spectrums of the lower half polarized channels (5≤l≤8) of a polar code with code length 8 can be directly obtained based on the polar weight spectrum of the polar code with code length 4 and a formula $$\begin{cases} A_{2N}^{(l)}(p) = A_N^{(i)}(j), p = 2j, \\ A_{2N}^{(l)}(p) = 0, p \text{ is a positive odd number less than } 2N \end{cases}.$$

The method for calculating the polar weight spectrums of the upper half polarized channels (1≤l≤4) of the polar code with code length 8 will be described in the following step. The polar weight spectrums of the lower half polarized channels (5≤l≤8) of the polar code with code length 8 are shown in the following Table 11.

TABLE 11

| | p polar weight spectrum | | | | | | | | |
|---|---|---|---|---|---|---|---|---|---|
| l | 0 | 1 | 2 | 3 | 4 | 5 | 6 | 7 | 8 |
| 8 | 0 | 0 | 0 | 0 | 0 | 0 | 0 | 0 | 1 |
| 7 | 0 | 0 | 0 | 0 | 2 | 0 | 0 | 0 | 0 |
| 6 | 0 | 0 | 0 | 0 | 4 | 0 | 0 | 0 | 0 |
| 5 | 0 | 0 | 4 | 0 | 0 | 0 | 4 | 0 | 0 |

It can be seen from Table 11 that for 5≤l≤8, the number of the codewords with odd weight is 0 while the number of the codewords with even weight is equal to the corresponding item in Table 10.

S102, calculate the polar weight spectrum $A_{2N}^{(m)}(p)$ corresponding to the $m^{th}$ polarized channel of the polar code with code length 2N, based on the polar weight spectrum $A_{2N}^{(l)}(p)$ corresponding to the $l^{th}$ polarized channel and the MacWilliams identities, where m=1, 2, . . . , N;

Specifically, for m=1, 2, . . . , N, based on the structure of the matrix $F_{2N}$, the index of the polarized channel m is corresponding to the upper half of the matrix $F_{2N}$, which is composed by partial row vectors of the $F_N$ matrix. For the polar code with code length 2N, the dual code of the (2N, 2N−m+1) linear block code corresponding to the $m^{th}$ polarized channel is a (2N, m−1) linear block code. Hence, it can be derived that the dual polarized channel of the $m^{th}$ polarized channel is the one with index 2N−(m−1)+1, that is, 2N−m+2. Therefore, for the polarized channels with m=2, 3, . . . , N, their corresponding dual polarized channels can be found in the lower half part of the polarized channels described in S101. Meanwhile, the dual code of the (2N, 2N−m+1) linear block code corresponding to the $m^{th}$ polarized channel also can be found in S101.

For example, the duality relationships between the polarized channels of the polar code with code length 8 are shown in the following Table 12.

TABLE 12

| channel index | index of the dual channel |
|---|---|
| 8 | 2 |
| 7 | 3 |
| 6 | 4 |
| 5 | 5 |

It can be found from Table 12 that the polarized channel with m=1 does not have a dual polarized channel, therefore, its polar weight spectrum will be calculated later.

Given the code length 2N, the weight spectrums of the polarized channels with index N+1, N+2, . . . , 2N can be determined based on the corresponding polar weight spectrums. Then, the weight spectrums of the polarized channels with index 1, 2, . . . , N can be calculated via the MacWilliams identities because the weight spectrums of a pair of dual codes satisfy the MacWilliams identities. Finally, the polar weight spectrums of the polarized channels with index 1, 2, . . . , N can be calculated by using the weight spectrums.

S103, calculate, for each polarized channel, the union bound on the error probability of the polarized channel under the condition of additive white Gaussian noise channel based on the polar weight spectrum corresponding to the polarized channel of the polar code with code length 2N and the union bound calculation formula;

Under the condition of additive white Gaussian noise channel, an upper bound on the error probability of the polarized channel can be calculated based on the polar weight spectrum, which is named as the union bound. The union bound can be used to characterize the reliability of the polarized channel, which means the smaller the union bound, the higher the reliability of the polarized channel.

S104, determine the error probability threshold values of the polarized channels based on the union bounds of the polarized channels and a predetermined measurement method.

In the embodiments of the present application, after the union bound of each polarized channel is obtained via S103, the error probability threshold value of the polarized channel can be obtained by using the predetermined measurement method. In this way, the error probability threshold value of the polarized channel can be set according to the practical requirement.

S105, given the code length 2N and code rate K/2N, sort the error probability threshold values of all the polarized channels in ascending order, and select the polarized channels corresponding to the K smallest error probability threshold values to transmit information bits, while select the rest of the polarized channels to transmit frozen bits, where K denotes the length of information bits.

Since the smaller the error probability threshold value is, the higher the reliability of the polarized channel is, when constructing the polar code with code length 2N and code rate K/2N, the polarized channels corresponding to the K smallest error probability threshold values are chosen to transmit information bits while the others are selected to transmit frozen bits.

For example, given the code length 1024 and code rate 0.5, i.e., the length of information bits is 512, the error probability threshold values corresponding to all of 1024 polarized channels are calculated firstly when constructing the polar code. Then, all of the error probability threshold values are sorted in ascending order and the smaller threshold value means the corresponding polarized channel is more reliable. Therefore, when constructing a polar code, the polarized channels corresponding to the 512 smallest error probability threshold values are chosen to transmit information bits while the others are selected to transmit frozen bits.

In the method for constructing a polar code provided by embodiments of this application: the polar weight spectrum corresponding to each polarized channel of the polar code with code length 2N is calculated, based on the polar weight spectrum corresponding to each polarized channel of the polar code with code length N and the MacWilliams identities; the union bound of each polarized channel under the condition of the additive white Gaussian noise channel is calculated based on the polar weight spectrum corresponding to each polarized channel of the polar code with code length 2N and the union bound calculation formula; the error probability threshold value of each polarized channel is determined based on the union bound and a predetermined measurement method; given the code length 2N and code rate K/2N, the error probability threshold values are sorted in ascending order, and the polarized channels corresponding to the K smallest error probability threshold values are selected to transmit information bits, while the rest of the polarized channels are selected to transmit frozen bits. The construction method of polar codes provided by the embodiments of this application can be SNR-independent, which reduces the complexity for constructing a polar code, and has a good practical prospect for the polar coded transmission system.

An implementation of the present application, the embodiment S102 in FIG. 1 comprises the following steps.

Firstly, calculate the weight spectrum $S_{2N}^{(l)}(p)$ corresponding to the $l^{th}$ polarized channel of the polar code with code length 2N by using $$S_{2N}^{(l)}(p) = \sum_{h=l}^{2N} A_{2N}^{(h)}(p).$$

Specifically, for the polar code with code length 2N, the polar weight spectrums of the polarized channels with index from N+1 to 2N have been calculated in S101. In order to calculate the polar weight spectrums of the polarized channels with index from 1 to N by using the MacWilliams identities, the weight spectrums of the polarized channels with index from N+1 to 2N, i.e., $S_{2N}^{(l)}(p)$ are required to be calculated firstly.

Specifically, the linear block code is usually represented as (2N,K), where 2N denotes the code length, K denotes the length of information bits, and the code rate is denoted by R=K/2N. For the $l^{th}$ polarized channel, the code rate of its corresponding linear block code is $$R = \frac{2N-l+1}{2N},$$

that is, the corresponding linear block code is a (2N,2N−l+1) code. Let $\{S_{2N}^{l}(p)\}$ denote the weight spectrum of the $l^{th}$ polarized channel, where p (0≤p≤2N) is the Hamming weight of codeword and $S_{2N}^{(l)}(p)$ is the number of codewords of weight p for the (2N,2N−l+1) linear block code. Similarly, let $\{A_{2N}^{l}(p)\}$ denote the polar weight spectrum, where $A_{2N}^{l}(p)$ is the number of codewords of weight p for a subset of the (2N,2N−l+1) linear block code. The weight spectrum $S_{2N}^{(l)}(p$ (p≠0) of the $l^{th}$ polarized channel is obtained by accumulating the polar weight spectrums of the polarized channels with index from 1 to 2N, and there is always one all-zero codeword corresponds to each polarized channel, that is, $$S_{2N}^{(l)}(p) = \sum_{t=l}^{2N} A_n^{(t)}(p), p = 1, 2, \ldots, 2N,$$

$$S_{2N}^{(l)}(p) = 1, p = 0.$$

For example, the polar weight spectrum of the polar code with code length 4 is shown in Table 10 and the corresponding weight spectrum is shown in Table 13.

TABLE 13

| | \multicolumn{5}{c}{j weight spectrum} | | | | |
|---|---|---|---|---|---|
| i | 0 | 1 | 2 | 3 | 4 |
| 4 | 1 | 0 | 0 | 0 | 1 |
| 3 | 1 | 0 | 2 | 0 | 1 |
| 2 | 1 | 0 | 6 | 0 | 1 |
| 1 | 1 | 4 | 6 | 4 | 1 |

Secondly, calculate the weight spectrum $S_{2N}^{(m)}(p)$ corresponding to the $m^{th}$ polarized channel of the polar code with code length 2N based on the MacWilliams identities $$\sum_{p=0}^{2N-v} \binom{2N-p}{v} S_{2N}^{(m)}(p) = 2^{2N-m+1-v} \sum_{p=0}^{v} \binom{2N-p}{2N-v} S_{2N}^{(2N+2-m)}(p),$$

where $$\binom{2N-p}{v} = \frac{(2N-p)!}{v!(2N-p-v)!}, \binom{2N-p}{2N-v} = \frac{(2N-p)!}{(2N-v)!(v-p)!},$$

and v = 0, 1, ..., 2N.

In this step, for each of the polarized channels with index m=2, 3, ..., N, the code weight p=0, 1, 2, ..., 2N, that is, there are 2N+1 unknowns. Meanwhile, there are 2N+1 equations in total since v=0, 1, ..., 2N and an equation can be obtained once the value of v is determined. In each of the equations, the range of p in the equation will be determined after v is determined, where the range of p is {0, 1, ..., 2N-v} for the left side of the equation and that is {0, 1, ..., v} for the right side of the equation. It can be known that the number of the unknowns is equal to the number of the equations, thus, for each of polarized channels, its corresponding equation group has the unique solution.

Further, the above equation group can be solved iteratively according to the triangular characteristics of the unknown coefficients to obtain the weight spectrum $S_{2N}^{(m)}(p)$.

Firstly, let v=2N, then an equation can be derived as $$\binom{2N}{2N} S_{2N}^{(m)}(0) = 2^{-m+1} \sum_{p=0}^{2N} \binom{2N-p}{0} S_{2N}^{(2N+2-m)}(p).$$

It can be found that there is only one unknown at the left side of the equation, and the right side of the equation is a known quantity because the weight spectrums $S_{2N}^{2N+2-m}(p)$, m=2, 3, ..., N, p=0, 1, ..., 2N have been calculated. Therefore, the unknown of the equation can be directly calculated by $$S_{2N}^{(m)}(0) = 2^{-m+1} \sum_{p=0}^{2N} S_{2N}^{(2N+2-m)}(p).$$

Then, let v=2N−1, then an equation can be derived as $$\sum_{p=0}^{1} \binom{2N-p}{2N-1} S_{2N}^{(m)}(p) = 2^{-m+2} \sum_{p=0}^{2N-1} \binom{2N-p}{1} S_{2N}^{(2N+2-m)}(p).$$

At this time, there are two unknowns $S_{2N}^{(m)}(0)$ and $S_{2N}^{(m)}(1)$ at the left side of the equation, where $S_{2N}^{(m)}(0)$ is already obtained from the previous step, therefore, the unknown $S_{2N}^{(m)}(1)$ can be calculated by $$S_{2N}^{(m)}(1) = 2^{-m+2} \sum_{p=0}^{2N-1} (2N-p) S_{2N}^{(2N+2-m)}(p) - 2N \times S_{2N}^{(m)}(0).$$

In the same way, the values of $S_{2N}^{(m)}(2)$, $S_{2N}^{(m)}(3)$, ..., $S_{2N}^{(m)}(2N)$ can be obtained in turn. In practical applications, except for the first one, the number of codewords with positive odd weight corresponding to the polarized channels is zero, i.e., $S_{2N}^{(m)}(p)=0$, where m=2, 3, ..., N and p=1, 3, ..., 2N−1. Therefore, the computational complexity of solving the equations can be reduced by half.

Finally, calculate the polar weight spectrum $A_{2N}^{(m)}(p)$ corresponding to the $m^{th}$ polarized channel of the polar code with code length 2N by using $A_{2N}^{(m)}(p)=S_{2N}^{(m)}(p)-S_{2N}^{(m+1)}(p)$, m=2, 3, ..., N, p=0, 1, ..., 2N.

In the embodiment of this application, the polar weight spectrum of each polarized channel should be calculated as above because it will be used for calculating the union bound on the error probability of the polarized channel. Therefore, the polar weight spectrums of polarized channels (m=2, 3, . . . , N) is calculated based on the formula $$A_{2N}^{(m)}(p) = S_{2N}^{(m)}(p) - S_{2N}^{(m+1)}(p).$$

So far, only the polar weight spectrum of the first polarized channel (m=1) is unknown. Considering the characteristic of the polar code, the total number of codewords of weight p satisfies the binomial distribution, that is, the total is $$\binom{2N}{p}.$$

Therefore, the polar weight spectrum of the first polarized channel can be obtained by subtracting those of the rest polarized channels from the total, that is, $$A_{2N}^{(1)}(p) = \binom{2N}{p} - S_{2N}^{(2)}(p), \binom{2N}{p} = \frac{(2N)!}{p!(2N-p)!}.$$

In the above step, to calculate the weight spectrum of the polar code with code length 2N, it is only required to solve N−1 groups of linear equations with 2N+1 unknowns so that the complexity of solving each linear equation group is of $O(N^2)$, then the total complexity is $O(N^3)$, which is bearable for the medium code length. Theoretically, the method can be extended to any code length. The polar weight spectrum of the polar code with code length 8 obtained above is shown in Table 14 below.

TABLE 14

| | polar weight spectrum | | | | | | | | |
|---|---|---|---|---|---|---|---|---|---|
| | 0 | 1 | 2 | 3 | 4 | 5 | 6 | 7 | 8 |
| 8 | 0 | 0 | 0 | 0 | 0 | 0 | 0 | 0 | 1 |
| 7 | 0 | 0 | 0 | 0 | 2 | 0 | 0 | 0 | 0 |
| 6 | 0 | 0 | 0 | 0 | 4 | 0 | 0 | 0 | 0 |
| 5 | 0 | 0 | 4 | 0 | 0 | 0 | 4 | 0 | 0 |
| 4 | 0 | 0 | 0 | 0 | 16 | 0 | 0 | 0 | 0 |
| 3 | 0 | 0 | 8 | 0 | 16 | 0 | 8 | 0 | 0 |
| 2 | 0 | 0 | 16 | 0 | 32 | 0 | 16 | 0 | 0 |
| 1 | 0 | 8 | 0 | 56 | 0 | 56 | 0 | 8 | 0 |

In an implementation of the present application, the embodiment S103 in FIG. 1, the union bound of the $q^{th}$ polarized channel under the condition of additive white Gaussian noise channel can be determined as $$P_{UB}(W_{2N}^{(q)}) = \sum_p A_{2N}^{(q)}(p) \exp\left\{-p\frac{E_s}{N_0}\right\}$$

by using the formula $$P(W_{2N}^{(q)}) \leq \sum_p A_{2N}^{(q)}(p) \exp\left\{-p\frac{E_s}{N_0}\right\},$$

where q=1, 2, . . . , 2N, $P(W_{2N}^{(q)})$ denotes the error probability of the $q^{th}$ polarized channel, $E_s$ denotes the average energy of the transmitted signal, $N_0$ denotes the noise power spectral density, and $E_s/N_0$ denotes the symbol signal-to-noise ratio (SNR).

Accordingly, in S104, by using the Jacobian transformation on the logarithmic form of the union bound, the first universal construction metric can be obtained as $$UBW_{2N}^{(q)} = \max_p \left\{\ln[A_{2N}^{(q)}(p)] - p\frac{E_s}{N_0}\right\}.$$

Let $L_{2N}^{(q)}(p) = \ln[A_{2N}^{(q)}(p)]$ denote the logarithmic form of the polar weight spectrum, where ln(·) denotes the natural logarithm with base e=2.71828 . . . , then the first universal construction metric can be further expressed as $$UBW_{2N}^{(q)} = \max_p \left\{L_{2N}^{(q)}(p) - p\frac{E_s}{N_0}\right\}.$$

The first universal construction metric can be transformed into a simplified SNR-independent universal construction metric by selecting an optimized value of $E_s/N_0$, which can be determined according to the code length and code rate in practical applications.

Under the condition of high signal-to-noise ratio, the reliability of each polarized channel is mainly determined by the polar weight spectrum corresponding to the minimum Hamming weight. The Hamming weight of a binary codeword is equal to the number of 1s in the codeword. Therefore, the first universal construction metric given above can be simplified as the second universal construction metric $$UBWW_{2N}^{(q)} = \ln[A_{2N}^{(q)}(p_{min})] - p_{min}\frac{E_s}{N_0}.$$

Let $L_{2N}^{(q)}(p_{min}) = \ln[A_{2N}^{(q)}(p_{min})]$ denote the logarithmic form of the polar weight spectrum corresponding to the minimum Hamming weight, then the second universal construction metric can be further expressed as $$UBWW_{2N}^{(q)} = L_{2N}^{(q)}(p_{min}) - p_{min}\frac{E_s}{N_0}.$$

Similarly, the value of the signal-to-noise ratio $E_s/N_0$ can be fixed to obtain a simplified universal construction metric that is independent of $E_s/N_0$, and the value of $E_s/N_0$ can be determined according to the code length and code rate in practical applications.

An implementation of the present application, the embodiment S104 in FIG. 1 comprises:

for each of the polarized channels, determining the union bound of the polarized channel as the error probability threshold value of the polarized channel; or determining the logarithmic form of the union bound of the polarized channel as the error probability threshold value of the polarized channel; or selecting the item corresponding to the minimum Hamming weight in the logarithmic form of the union bound of the polarized channel as the error probability threshold value of the polarized channel.

In the embodiment of the present application, the union bound of the polarized channel can be directly determined as the error probability threshold value of the polarized channel. In addition, the first universal construction metric derived based on the logarithmic form of the union bound also can be regarded as the error probability threshold value. Finally, since the reliability of each polarized channel is mainly determined by the polar weight spectrum corresponding to the minimum Hamming weight in the case of high signal-to-noise ratio, the second universal construction metric also can be regarded as the error probability threshold value and obtained based on the first universal construction metric by only considering the logarithmic form of the polar weight spectrum corresponding to the minimum Hamming weight. Of course, there may be a variety of methods for determining the error probability threshold value; all the methods for determining the error probability threshold value based on the union bound belong to the scope of protection of the present application.

Figure 2:
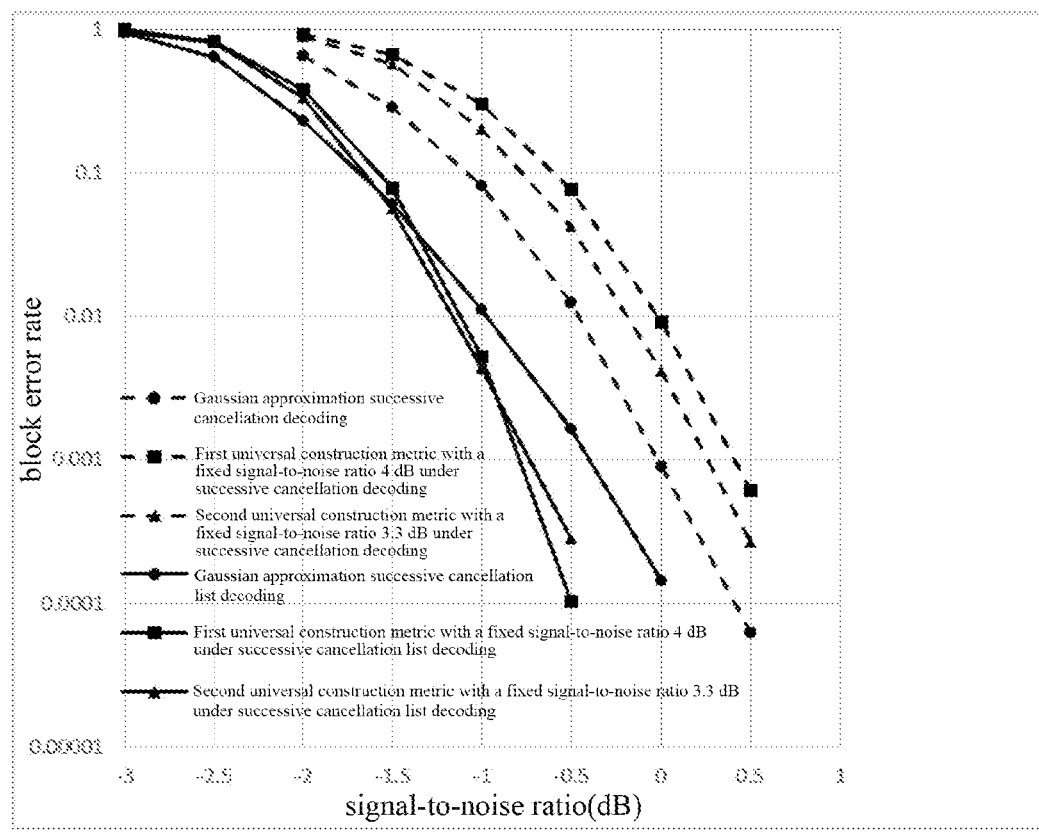
FIG. 2 compares the block error rate performances of polar codes constructed by the Gaussian approximation algorithm and the method proposed by the embodiment of this application.

For example, given the code length N=1024 and code rate 0.5, FIG. 2 compares the block error rate performances of polar codes constructed by the Gaussian approximation algorithm and the two universal construction metrics proposed by the embodiment of this application. The successive cancellation (SC) decoding and the successive cancellation list (SCL) decoding with list size 16 are respectively used to decode the polar codes. The vertical axis denotes the block error rate of polar codes while the horizontal axis denotes the signal-to-noise ratio. The value of $E_s/N_0$ in the first universal construction metric is fixed as 4 dB and that in the second universal construction metric is set to 3.3 dB.

It can be observed from FIG. 2 that the polar codes constructed by the universal construction metrics proposed by this application can achieve approximate or even better performances than those constructed by the Gaussian approximation algorithm. Besides, the two universal construction metrics proposed by this application are independent of SNR, which leads to a much lower complexity of constructing polar codes.

Figure 3:
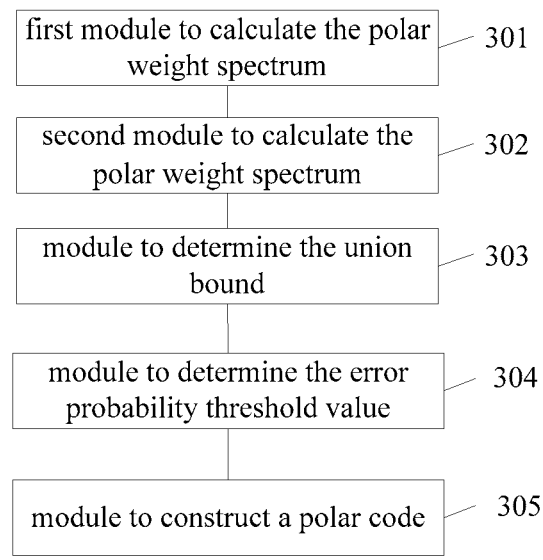
FIG. 3 shows a structural diagram of an apparatus for constructing a polar code according to an embodiment of this application.

According to the embodiment of the above method, an apparatus for constructing a polar code is provided in the embodiment of this application, whose structural diagram is shown in FIG. 3. The apparatus comprises:

a first module to calculate the polar weight spectrum 301, configured for) calculating a polar weight spectrum $A_{2N}^{(l)}(p)$ corresponding to an $l^{th}$ polarized channel of a polar code with code length 2N based on a polar weight spectrum corresponding to an $l^{th}$ polarized channel of a polar code with code length N and a formula $$\begin{cases} A_{2N}^{(l)}(p) = A_N^{(i)}(j), \ p = 2j, \\ A_{2N}^{(l)}(p) = 0, \ p \text{ is a positive odd number less then } 2N \end{cases},$$

where i=1, 2, . . . , N, l=i+N, j=0, 1, 2, . . . , N, j denotes a weight of a codeword in the polar code with code length N, p denotes a weight of a codeword in the polar code with code length 2N, N=$2^x$, x is a positive integer;

a second module to calculate the polar weight spectrum 302, configured for calculating a polar weight spectrum $A_{2N}^{(m)}(p)$ corresponding to an $m^{th}$ polarized channel of the polar code with code length 2N, based on the polar weight spectrum $A_{2N}^{(l)}(p)$ corresponding to the $l^{th}$ polarized channel and the MacWilliams identities, where m=1, 2, . . . , N;

a module to determine the union bound 303, configured for calculating, for each polarized channel, a union bound on an error probability of the polarized channel under the condition of additive white Gaussian noise channel based on the polar weight spectrum corresponding to the polarized channel of the polar code with code length 2N and the union bound calculation formula;

a module to determine the error probability threshold value 304, configured for determining error probability threshold values of the polarized channels based on the union bounds of the polarized channels and a predetermined measurement method;

a module to construct a polar code 305, configured for, given the code length 2N and code rate K/2N, sorting error probability threshold values of all the polarized channels in ascending order, and selecting the polarized channels corresponding to the K smallest error probability threshold values to transmit information bits, while selecting the rest of the polarized channels to transmit frozen bits, where K denotes the length of information bits.

In the apparatus for constructing a polar code according to the embodiment of the present application: the polar weight spectrum corresponding to each polarized channel of the polar code with code length 2N is calculated, based on the polar weight spectrum corresponding to each polarized channel of the polar code with code length N and the MacWilliams identities; the union bound of each polarized channel under the condition of the additive white Gaussian noise channel is calculated based on the polar weight spectrum corresponding to each polarized channel of the polar code with code length 2N and the union bound calculation formula; the error probability threshold value of each polarized channel is determined based on the union bound and a predetermined measurement method; given the code length 2N and code rate K/2N, the error probability threshold values are sorted in ascending order, and the polarized channels corresponding to the K smallest error probability threshold values are selected to transmit information bits, while the rest of the polarized channels are selected to transmit frozen bits. The construction method of polar codes provided by the embodiments of this application can be SNR-independent, which reduces the complexity for constructing a polar code, and has a good practical prospect for the polar coded transmission system.

In an implementation of the present application, the module to determine the error probability threshold value comprises:

a first sub-module, configured for, for each of the polarized channels, determining the union bound of the polarized channel as the error probability threshold value of the polarized channel; or a second sub-module, configured for, for each of the polarized channels, determining a logarithmic form of the union bound of the polarized channel as the error probability threshold value of the polarized channel; or a third sub-module, configured for, for each of the polarized channels, selecting an item corresponding to a minimum Hamming weight in the logarithmic form of the union bound of the polarized channel as the error probability threshold value of the polarized channel.

In an implementation of the present application, the second module to calculate the polar weight spectrum is specifically configured for: calculating a weight spectrum $S_{2N}^{(l)}(p)$ corresponding to the $l^{th}$ polarized channel of the polar code with code length 2N by using a formula $$S_{2N}^{(l)}(p) = \sum_{h=l}^{2N} A_{2N}^{(h)}(p);$$

calculating a weight spectrum $S_{2N}^{(m)}(p)$ corresponding to the $m^{th}$ polarized channel of the polar code with code length 2N based on the MacWilliams identities $$\sum_{p=0}^{2N-v}\binom{2N-p}{v}S_{2N}^{(m)}(p) = 2^{2N-m+1-v}\sum_{p=0}^{v}\binom{2N-p}{2N-v}S_{2N}^{(2N+2-m)}(p),$$

where $\binom{2N-p}{v} = \frac{(2N-p)!}{v!(2N-p-v)!}$, $\binom{2N-p}{2N-v} = \frac{(2N-p)!}{(2N-v)!(v-p)!}$, and $v = 0, 1, \ldots, 2N$;

calculating the polar weight spectrum $A_{2N}^{(m)}(p)$ corresponding to the $m^{th}$ polarized channel of the polar code with code length 2N by using $A_{2N}^{(m)}(p)=S_{2N}^{(m)}(p)-S_{2N}^{(m+1)}(p)$.

In an implementation of the present application, the module to determine the union bound is specifically configured for: determining a union bound of a $q^{th}$ polarized channel under the condition of the additive white Gaussian noise channel as $$P_{UB}(W_{2N}^{(q)}) = \sum_p A_{2N}^{(q)}(p)\exp\left\{-p\frac{E_s}{N_0}\right\}$$

by using a formula $$P(W_{2N}^{(q)}) \leq \sum_p A_{2N}^{(q)}(p)\exp\left\{-p\frac{E_s}{N_0}\right\},$$

where $q=1, 2, \ldots, 2N$, denotes an error probability of the $q^{th}$ polarized channel, $E_s$ denotes an average energy of the transmitted signal, $N_0$ denotes noise power spectrum density, $E_s/N_0$ denotes a symbol signal-to-noise ratio (SNR).

Figure 4:
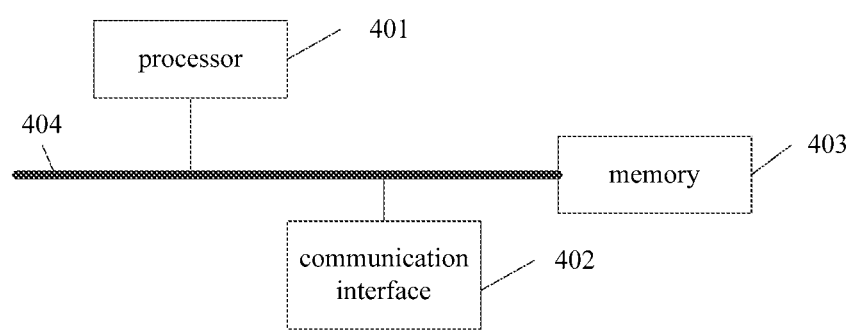
FIG. 4 shows a structural diagram of an electronic device according to an embodiment of this application.

An embodiment of the present application further provides an electronic device. Referring to FIG. 4, FIG. 4 is a structural diagram of an electronic device according to an embodiment of the present application. The electronic device comprises: a processor 401, a communication interface 402, a memory 403 and a communication bus 404, where the processor 401, the communication interface 402 and the memory 403 communicate with each other via the communication bus 404;

the memory 403 is configured for storing a computer program;

the processor 401 is configured for implementing steps of any method for constructing a polar code when executing the computer program stored in the memory 403.

It should be understood that, the communication bus 404 mentioned for the electronic device may be a Peripheral Component Interconnect (PCI) bus or an Extended Industry Standard Architecture (EISA) bus and the like. The communication bus 404 can be classified as an address bus, a data bus, a control bus and the like. In FIG. 4, only a thick line is used, but it does not mean that there is only one bus or one type of bus.

The communication interface 402 is configured for communication between the above electronic device and other devices.

The memory 403 may comprise a Random Access Memory (RAM), may further comprise a non-volatile memory, for example, at least one disk memory. Optionally, the memory may also be at least one storage device located far from the processor.

The above processor 401 may be a general-purpose processor, comprising: a Central Processing Unit (CPU), a Network Processor (NP) and the like; or a Digital Signal Processing (DSP), an Application Specific Integrated Circuit (ASIC), a Field-Programmable Gate Array (FPGA) or other programmable logic devices, discrete gates or transistor logic devices, discrete hardware components.

In the electronic device of the present application, by executing the program stored in the memory, the processor: calculates the polar weight spectrum corresponding to each polarized channel of the polar code with code length 2N, based on polar weight spectrums corresponding to each polarized channel of the polar code with code length N and the MacWilliams identities; calculates a union bound of each of the polarized channels under the condition of the additive white Gaussian noise channel based on the polar weight spectrum corresponding to each polarized channel in the polar code with code length 2N and a union bound calculation formula; determines an error probability threshold value of each polarized channel based on the union bound and a predetermined measurement method; given the code length 2N and code rate K/2N, sorts error probability threshold values in ascending order, selects polarized channels corresponding to the K smallest error probability threshold values to transmit information bits, and selects the rest of the polarized channels to transmit frozen bits. The construction method of polar codes provided by the embodiments of this application can be SNR-independent, which reduces the complexity for constructing a polar code, and has a good practical prospect for the polar coded transmission system.

An embodiment of the present application further provides a computer-readable storage medium. The computer-readable medium stores a computer program therein, when being executed by a processor, implements steps of any method for constructing a polar code.

The instructions, when being executed by a computer, stored in the computer-readable storage medium according to the embodiment of the present application: calculate the polar weight spectrum corresponding to each polarized channel of the polar code with code length 2N, based on polar weight spectrums corresponding to each polarized channel of the polar code with code length N and the MacWilliams identities; calculate a union bound of each of the polarized channels under the condition of the additive white Gaussian noise channel based on the polar weight spectrum corresponding to each polarized channel in the polar code with code length 2N and a union bound calculation formula; determine an error probability threshold value of each polarized channel based on the union bound and a predetermined measurement method; given the code length 2N and code rate K/2N, sort error probability threshold values in ascending order, select polarized channels corresponding to the K smallest error probability threshold values to transmit information bits, and select the rest of the polarized channels to transmit frozen bits. The construction method of polar codes provided by the embodiments of this application can be SNR-independent, which reduces the complexity for constructing a polar code, and has a good practical prospect for the polar coded transmission system.

The embodiments described above are simply preferable embodiments of the present application, and are not intended to limit the scope of protection of the present application. Any modifications, alternatives, improvements, or the like within the spirit and principle of the present application shall be included within the scope of protection of the present application.

The invention claimed is:

1. A method for constructing a polar code, comprising:

calculating a polar weight spectrum $A_{2N}^{(l)}(p)$ corresponding to an $l^{th}$ polarized channel of a polar code with code length 2N based on a polar weight spectrum $A_{N}^{(i)}(j)$ corresponding to an $i^{th}$ polarized channel of a polar code with code length N and a formula $$\begin{cases} A_{2N}^{(l)}(p) = A_{N}^{(i)}(j), \ p = 2j, \\ A_{2N}^{(l)}(p) = 0, \ p \text{ is a positive odd number less then } 2N \end{cases},$$

where $i=1, 2, \ldots, N, l=i+N, j=0, 1, 2, \ldots, N$, j denotes a weight of a codeword in the polar code with code length N, p denotes a weight of a codeword in the polar code with code length 2N, $N=2^x$, x is a positive integer;

calculating a polar weight spectrum $A_{2N}^{(m)}(p)$ corresponding to an $m^{th}$ polarized channel of the polar code with code length 2N, based on the polar weight spectrum $A_{2N}^{(l)}(p)$ corresponding to the $l^{th}$ polarized channel and MacWilliams identities, where $m=1, 2, \ldots, N$;

calculating, for each polarized channel of the polar code with code length 2N, a union bound on an error probability of a polarized channel under a condition of additive white Gaussian noise channel based on the polar weight spectrum corresponding to the polarized channel and a union bound calculation formula;

determining error probability threshold values of the polarized channels based on the union bounds of the polarized channels and a predetermined measurement method;

given the code length 2N and code rate K/2N, sorting the error probability threshold values of all the polarized channels in ascending order, and selecting polarized channels corresponding to K smallest error probability threshold values to transmit information bits, while selecting remaining polarized channels to transmit frozen bits; where K denotes a length of information bits.

2. The method for constructing a polar code of claim 1, wherein, determining the error probability threshold values of the polarized channels based on the union bounds of the polarized channels and a predetermined measurement method, comprises:

for each of the polarized channels, determining the union bound of the polarized channel as the error probability threshold value of the polarized channel; or determining a logarithmic form of the union bound of the polarized channel as the error probability threshold value of the polarized channel; or selecting an item corresponding to a minimum Hamming weight in the logarithmic form of the union bound of the polarized channel as the error probability threshold value of the polarized channel.

3. The method for constructing a polar code of claim 1, wherein, calculating the polar weight spectrum $A_{2N}^{(m)}(p)$ corresponding to the $m^{th}$ polarized channel of the polar code with code length 2N, based on the polar weight spectrum $A_{2N}^{(l)}(p)$ corresponding to the $l^{th}$ polarized channel and the MacWilliams identities, comprises:

calculating the weight spectrum $S_{2N}^{(l)}(p)$ corresponding to the $l^{th}$ polarized channel of the polar code with code length 2N based on a formula $$S_{2N}^{(l)}(p) = \sum_{h=l}^{2N} A_{2N}^{(h)}(p);$$

calculating the weight spectrum $S_{2N}^{(m)}(p)$ corresponding to the $m^{th}$ polarized channel of the polar code with code length 2N based on the MacWilliams identities $$\sum_{p=0}^{2N-v} \binom{2N-p}{v} S_{2N}^{(m)}(p) = 2^{2N-m+1-v} \sum_{p=0}^{v} \binom{2N-p}{2N-v} S_{2N}^{(2N+2-m)}(p),$$

where $\binom{2N-p}{v} = \frac{(2N-p)!}{v!(2N-p-v)!}$, $\binom{2N-p}{2N-v} = \frac{(2N-p)!}{(2N-v)!(v-p)!}$, and $v = 0, 1, \ldots, 2N$;

calculating the polar weight spectrum $A_{2N}^{(m)}(p)$ corresponding to the $m^{th}$ polarized channel of the polar code with code length 2N based on $A_{2N}^{(m)}(p)=S_{2N}^{(m)}(p)-S_{2N}^{(m+1)}(p)$.

4. The method for constructing a polar code of claim 1, wherein, calculating, for each polarized channel, a union bound on an error probability of the polarized channel under the condition of additive white Gaussian noise channel based on the polar weight spectrum corresponding to the polarized channel of the polar code with code length 2N and the union bound calculation formula, comprises:

determining a union bound of a $q^{th}$ polarized channel under the condition of the additive white Gaussian noise channel as $$P_{UB}(W_{2N}^{(q)}) = \sum_p A_{2N}^{(q)}(p) \exp\left\{-p \frac{E_s}{N_0}\right\}$$

by using a formula $$P(W_{2N}^{(q)}) \leq \sum_p A_{2N}^{(q)}(p) \exp\left\{-p \frac{E_s}{N_0}\right\},$$

where $q=1, 2, \ldots, 2N$, $P(W_{2N}^{(q)})$ (denotes an error probability of the $q^{th}$ polarized channel, $E_s$, denotes an average energy of a transmitted signal, $N_0$ denotes noise power spectrum density, $E_s/N_0$ denotes a symbol signal-to-noise ratio (SNR).

5. An apparatus for constructing a polar code, comprising:

a first module to calculate a polar weight spectrum, configured for calculating a polar weight spectrum $A_{2N}^{(l)}(p)$ corresponding to an $l^{th}$ polarized channel of a polar code with code length 2N based on a polar weight spectrum $A_{N}^{(i)}(j)$ corresponding to an $i^{th}$ polarized channel of a polar code with code length N and a formula $$\begin{cases} A_{2N}^{(l)}(p) = A_{N}^{(i)}(j), \ p = 2j, \\ A_{2N}^{(l)}(p) = 0, \ p \text{ is a positive odd number less then } 2N \end{cases},$$

where i=1, 2, ..., N, l=i+N, j=0, 1, 2, ..., N, j denotes a weight of a codeword in the polar code with code length N, p denotes a weight of a codeword in the polar code with code length 2N, N=$2^x$, x is a positive integer;
- a second module to calculate a polar weight spectrum, configured for calculating a polar weight spectrum $A_{2N}^{(m)}(p)$ corresponding to an $m^{th}$ polarized channel of the polar code with code length 2N, based on the polar weight spectrum $A_{2N}^{(l)}(p)$ corresponding to the $l^{th}$ polarized channel and MacWilliams identities, where m=1, 2, ..., N;
- a module to determine a union bound, configured for calculating, for each polarized channel of the polar code with code length 2N, a union bound on an error probability of a polarized channel under a condition of additive white Gaussian noise channel based on the polar weight spectrum corresponding to the polarized channel and a union bound calculation formula;
- a module to determine error probability threshold values, configured for determining error probability threshold values of the polarized channels based on the union bounds of the polarized channels and a predetermined measurement method;
- a module to construct a polar code, configured for, given the code length 2N and code rate K/2N, sorting error probability threshold values of all the polarized channels in ascending order, and selecting the polarized channels corresponding to K smallest error probability threshold values to transmit information bits, while selecting remaining polarized channels to transmit frozen bits, where K denotes the length of information bits.

6. The apparatus for constructing a polar code of claim 5, wherein, the module to determine the error probability threshold value comprises:
- a first sub-module, configured for, for each of the polarized channels, determining the union bound of the polarized channel as the error probability threshold value of the polarized channel; or
- a second sub-module, configured for, for each of the polarized channels, determining a logarithmic form of the union bound of the polarized channel as the error probability threshold value of the polarized channel; or
- a third sub-module, configured for, for each of the polarized channels, selecting an item corresponding to a minimum Hamming weight in the logarithmic form of the union bound of the polarized channel as the error probability threshold value of the polarized channel.

7. The apparatus for constructing a polar code of claim 5, wherein, the second module to calculate a polar weight spectrum is specifically configured for: calculating a weight spectrum $S_{2N}^{(l)}(p)$ corresponding to the $l^{th}$ polarized channel of the polar code with code length 2N by using a formula $$S_{2N}^{(l)}(p) = \sum_{h=l}^{2N} A_{2N}^{(h)}(p);$$

calculating a weight spectrum $S_{2N}^{(m)}(p)$ corresponding to the $m^{th}$ polarized channel of the polar code with code length 2N based on the MacWilliams identities $$\sum_{p=0}^{2N-v} \binom{2N-p}{v} S_{2N}^{(m)}(p) = 2^{2N-m+1-v} \sum_{p=0}^{v} \binom{2N-p}{2N-v} S_{2N}^{(2N+2-m)}(p),$$

where $\binom{2N-p}{v} = \frac{(2N-p)!}{v!(2N-p-v)!}$, $\binom{2N-p}{2N-v} = \frac{(2N-p)!}{(2N-v)!(v-p)!}$, and $v = 0, 1, \ldots, 2N$;

calculating the polar weight spectrum $A_{2N}^{(m)}(p)$ corresponding to the $m^{th}$ polarized channel of the polar code with code length 2N by using $A_{2N}^{(m)}(p) = S_{2N}^{(m)}(p) - S_{2N}^{(m+1)}(p)$.

8. The apparatus for constructing a polar code of claim 5, wherein, the module to determine a union bound is specifically configured for: determining a union bound of a $q^{th}$ polarized channel under the condition of the additive white Gaussian noise channel as $$P(W_{2N}^{(q)}) \leq \sum_p A_{2N}^{(q)}(p) \exp\left\{-p \frac{E_s}{N_0}\right\},$$

by using a formula $$P_{UB}(W_{2N}^{(q)}) = \sum_p A_{2N}^{(q)}(p) \exp\left\{-p \frac{E_s}{N_0}\right\}$$

where q =1, 2, ..., 2N, $P(W_{2N}^{(q)})$ denotes an error probability of the $q^{th}$ polarized channel, $E_s$ denotes an average energy of a transmitted signal, $N_0$ denotes noise power spectrum density, $E_s/N_0$ denotes a symbol signal-to-noise ratio (SNR).

9. An electronic device, comprising: a processor, a communication interface, a memory and a communication bus, where the processor, the communication interface and the memory communicate with each other via the communication bus;
- the memory is configured for storing a computer program;
- the processor is configured for implementing steps of the method for constructing a polar code of claim 1 when executing the computer program stored in the memory.

10. A non-transitory computer-readable storage medium, wherein, the computer-readable storage medium stores a computer program therein, and the computer program, when being executed by a processor, implements steps of the method for constructing a polar code of claim 1.

* * * * *